(12) United States Patent  
Chuang (10) Patent No.: US 12,040,298 B2  
(45) Date of Patent: Jul. 16, 2024

(54) PACKAGING METHOD AND PACKAGING STRUCTURE THEREOF (71) Applicant: CHANGXIN MEMORY TECHNOLOGIES, INC., Hefei (CN)

(72) Inventor: Ling-Yi Chuang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 268 days.

(21) Appl. No.: 17/668,724

(22) Filed: Feb. 10, 2022

(65) Prior Publication Data

US 2023/0010585 A1 Jan. 12, 2023

Related U.S. Application Data (63) Continuation of application No. PCT/CN2021/113188, filed on Aug. 18, 2021.

(30) Foreign Application Priority Data

Jul. 9, 2021 (CN) .......................... 202110776998.4

(51) Int. Cl.  
*H01L 23/00* (2006.01)

(52) U.S. Cl.  
CPC .............. *H01L 24/16* (2013.01); *H01L 24/29* (2013.01); *H01L 24/73* (2013.01); *H01L 24/92* (2013.01);  
(Continued)

(58) Field of Classification Search  
CPC ......... H01L 24/16; H01L 24/29; H01L 24/73; H01L 24/92; H01L 2224/16227; H01L 2224/2919; H01L 2224/73204; H01L 2224/9211; H01L 24/32; H01L 2224/131; H01L 24/83; H01L 24/13; H01L 24/27; H01L 24/75; H01L 24/81; H01L 2224/0401; H01L 2224/2783; H01L 2224/29011; H01L 2224/32225; H01L 2224/16237; H01L 2224/29022; H01L 2224/2929; H01L 2224/32237; H01L 2224/73104; H01L 2224/75252; H01L 2224/75301; H01L 2224/81191; H01L 2224/81203; H01L 2224/81815;  
(Continued)

(56) References Cited

U.S. PATENT DOCUMENTS 6,121,689 A 9/2000 Capote  
6,297,560 B1 10/2001 Capote  
(Continued)

FOREIGN PATENT DOCUMENTS

CN 104701289 A 6/2015  
CN 111433907 A 7/2020

*Primary Examiner* — Douglas W Owens  
(74) *Attorney, Agent, or Firm* — Kilpatrick Townsend & Stockton LLP (57) ABSTRACT

Provided is a packaging method, including: providing a base with a groove in its surface, which includes at least one pad exposed by the groove; providing a chip having a first surface and a second surface opposite to each other, at least one conductive bump being provided on the first surface of the chip; filling a first binder in the groove; applying a second binder on the first surface of the chip and the conductive bump; and installing the chip on the base, the conductive bump passing through the first binder and the second binder to connect with the pad.

19 Claims, 10 Drawing Sheets

(52) U.S. Cl.
CPC .............. *H01L 2224/16227* (2013.01); *H01L 2224/2919* (2013.01); *H01L 2224/73204* (2013.01); *H01L 2224/9211* (2013.01)

(58) Field of Classification Search
CPC .......... H01L 2224/83193; H01L 2224/83203; H01L 2224/83862; H01L 2924/35121
See application file for complete search history.

(56) References Cited

U.S. PATENT DOCUMENTS

| | | |
|---|---|---|
| 6,518,677 B1 | 2/2003 | Capote |
| 6,566,234 B1 | 5/2003 | Capote |
| 6,774,493 B2 | 8/2004 | Capote |
| 10,622,223 B2 | 4/2020 | Luo |
| 10,763,131 B2 | 9/2020 | Luo |
| 11,004,697 B2 | 5/2021 | Luo |
| 2002/0014703 A1 | 2/2002 | Capote |
| 2003/0218261 A1 | 11/2003 | Capote |
| 2005/0218517 A1 | 10/2005 | Capote |
| 2006/0030075 A1* | 2/2006 | Sugiyama ............... H01L 24/29 257/E21.503 |
| 2006/0145357 A1 | 7/2006 | Chen |
| 2014/0098507 A1 | 4/2014 | Kim et al. |
| 2015/0162265 A1 | 6/2015 | Jo |
| 2019/0157111 A1 | 5/2019 | Luo et al. |
| 2019/0157112 A1 | 5/2019 | Luo et al. |
| 2019/0311918 A1 | 10/2019 | Luo et al. |
| 2021/0257226 A1 | 8/2021 | Luo et al. |

\* cited by examiner

PACKAGING METHOD AND PACKAGING STRUCTURE THEREOF

CROSS-REFERENCE TO RELATED APPLICATIONS

This application is a continuation application of International Application No. PCT/CN2021/113188, filed on Aug. 18, 2021, which claims priority to Chinese Patent Application No. 202110776998.4, filed on Jul. 9, 2021. The disclosures of International Application No. PCT/CN2021/113188 and Chinese Patent Application No. 202110776998.4 are incorporated herein by reference in their entireties.

BACKGROUND

A flip chip technology is a chip interconnection technology. At present, the flip chip technology has become a frequently used packaging form in the field of high-end devices and high-density packaging.

In the existing flip chip technology, a chip and a base are fixedly connected by a binder.

However, when a groove is formed around a pad in the base, air is likely to remain in the groove during the flip chip installing process, which affects the reliability of connection between the chip and the base.

SUMMARY

This disclosure relates to, but is not limited to, a packaging method and a packaging structure thereof.

Embodiments of this disclosure provide a packaging method, including the following operations. A base with a groove in its surface is provided, which includes at least one pad exposed by the groove.

A chip is provided, which has a first surface and a second surface opposite to each other, in which at least one conductive bump is provided on the first surface of the chip.

A first binder is filled in the groove.

A second binder is applied on the first surface of the chip and the conductive bump.

The chip is installed on the base, with the conductive bump passing through the first binder and the second binder to connect with the pad.

Embodiments of this disclosure further provide a packaging structure, including a base with a groove in its surface, a first binder, a chip and a second binder.

The base includes at least one pad exposed by the groove.

The first binder is filled in the groove.

The chip has a first surface and a second surface opposite to each other, in which at least one conductive bump is provided on the first surface of the chip.

The second binder is located between the first surface of the chip and the first binder, in which the conductive bump passes through the second binder and the first binder to connect with the pad.

DETAILED DESCRIPTION

Exemplary embodiments disclosed in this disclosure will be described in more detail below with reference to the drawings. Although the exemplary embodiments of this disclosure are shown in the drawings, it should be understood that this disclosure may be implemented in various forms and should not be limited by the specific embodiments set forth herein. On the contrary, these embodiments are provided for a more thorough understanding of this disclosure, and to fully convey the scope of the disclosure of this disclosure to those skilled in the art.

In the following description, a lot of specific details are given in order to provide a more thorough understanding of this disclosure. However, it is apparent to those skilled in the art that this disclosure can be implemented without one or more of these details. In other examples, in order to avoid confusion with this disclosure, some technical features known in the art are not described. That is, not all the features of actual embodiments are described here, and known functions and structures are not described in detail.

In the drawings, the sizes of layers, regions and elements and the relative sizes thereof may be exaggerated for clarity. The same reference numerals denote the same elements throughout.

It should be understood that when an element or a layer is referred to as being "on", "adjacent to", "connected to" or "coupled to" other elements or layers, the element or the layer may be directly on, adjacent to, connected to or coupled to other elements or layers, or there may be intermediate elements or layers. On the contrary, when the element is referred to as being "directly on", "directly adjacent to", "directly connected to" or "directly coupled to" other elements or layers, there are no intermediate elements or layers. It should be understood that although the terms first, second, third, etc. may be used to describe various elements, components, regions, layers, and/or parts, these elements, components, regions, layers, and/or parts should not be limited by these terms. These terms are used merely to distinguish one element, component, region, layer, or part from another element, component, region, layer, or part. Therefore, a first element, component, region, layer, or part discussed below may be represented as a second element, component, region, layer, or part without departing from the teachings of this disclosure. When the second element, component, region, layer, or part is discussed, it does not mean that the first element, component, region, layer, or part is necessarily present in this disclosure.

Spatially relational terms such as "below . . . ", "under . . . ", "lower", beneath . . . ", "above . . . ", and "upper" and the like may be used herein for convenience of description to describe a relationship between one element or feature and another element or feature illustrated in the figures. It should be understood that in addition to the orientation shown in the figures, the spatially relational terms are intended to further include different orientations of devices in use and operation. For example, if the devices in the figures are turned over, elements or features described as being "under" or "beneath" or "below" other elements or features will be oriented to be "over" the other elements or features. Therefore, the exemplary terms "under . . . " and "below . . . " may include both upper and lower orientations. The device may be otherwise oriented (rotated by 90 degrees or in other orientations) and the spatial descriptors used herein may be interpreted accordingly.

The purpose of the terms used herein is only to describe specific embodiments and not as a limitation of this disclosure. As used herein, the singular forms "a/an", "one", and "the" are also intended to include the plural forms as well, unless the context clearly indicates otherwise. It should also be understood that when the terms "consist of" and/or "include" are used in this specification, the presence of the features, integers, steps, operations, elements, and/or components is determined, but the presence or addition of one or more other features, integers, steps, operations, elements, components, and/or groups is also possible. As used herein, the term "and/or" includes any and all combinations of the associated listed items.

Figure 1:
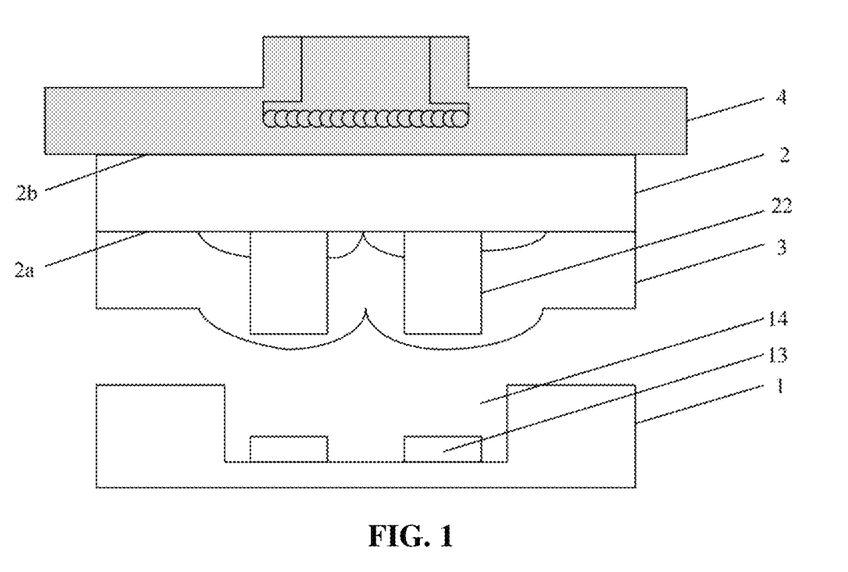
FIG. 1 is a schematic diagram of a packaging method provided in related technologies.

FIG. 1 is a schematic diagram of a packaging method provided in related technologies. As shown in the figure, a base 1 with a groove 14 in its surface is provided, which includes at least one pad 13 exposed by the groove 14.

A chip 2 is provided, which includes a first surface 2a and a second surface 2b which are arranged opposite to each other, in which at least one conductive bump 22 is formed on the first surface 2a.

A binder 3 is applied on the first surface 2a of the chip 2 and the conductive bump 22.

A thermo-compression means 4 is provided on the second surface 2b of the chip 2, by which the chip 2 is installed on the base 1, with the conductive bump 22 passing through the binder 3 to connect with the pad 13.

However, in the above packaging method, after the chip 2 is installed on the base 1, the binder 3 cannot fill up the groove 14, so that air often remains around the pad 13, resulting in the existence of voids. During the subsequent reflow soldering process, the remaining air easily causes bridging between pads 13, which affects the reliability of packaging.

Based on this, the following technical solutions of the embodiments of this disclosure are proposed.

Figure 2:
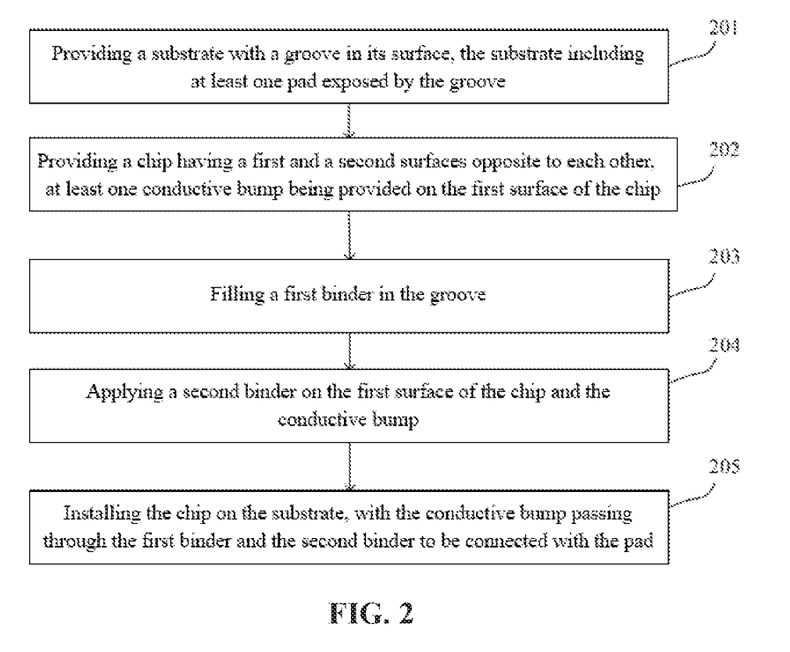
FIG. 2 is a flowchart of a packaging method provided in the embodiments of this disclosure.

The embodiments of this disclosure provide a packaging method. As shown in FIG. 2, the packaging method includes the following steps.

In 201, a base with a groove in its surface is provided, which includes at least one pad exposed by the groove.

In 202, a chip is provided, which has a first surface and a second surface opposite to each other, in which at least one conductive bump is provided on the first surface of the chip.

In 203, a first binder is filled in the groove.

In 204, a second binder is applied on the first surface of the chip and the conductive bump.

In 205, the chip is installed on the base, with the conductive bump passing through the first binder and the second binder to connect with the pad.

In the embodiments of this disclosure, the first binder is filled in the groove of the base before the chip is installed on the base, which can solve the problem that the air cannot be completely discharged from the groove in the process that the chip is installed on the base only through the second binder, thereby greatly reducing the probability of bridging between conductive bumps in the subsequent reflow soldering process, and thus improving the reliability of packaging.

In order to make the above objectives, features and advantages of this disclosure more apparent and understandable, the packaging method provided in the embodiments of this disclosure will be further described in detail below with reference to FIG. 3a to FIG. 3g.

Figure 3A:
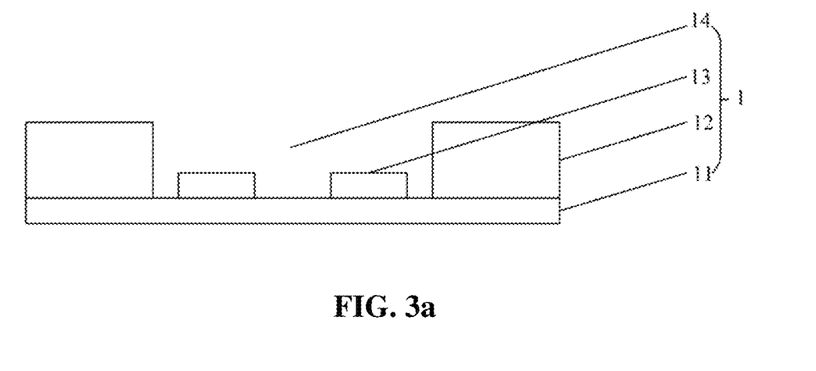
FIG. 3*a* to FIG. 3*g* are process flow diagrams of a packaging method provided in the embodiments of this disclosure.

Firstly, the step 201 is performed. As shown in FIG. 3a, a base 1 with a groove 14 in its surface is provided, which includes at least one pad 13 exposed by the groove 14.

In an embodiment, the base 1 further includes a support plate 11 and a solder mask 12. The step of providing a base 1 with a groove 14 in its surface includes: a support plate 11 is provided, and a solder mask 12 with a first opening is formed on the support plate 11, in which the first opening constitutes the groove 14 in the surface of the base.

In an embodiment, the base may be a Printed Circuit Board (PCB) or a bismaleimide triazine (BT) board, and the solder mask is green paint.

Figure 3B:
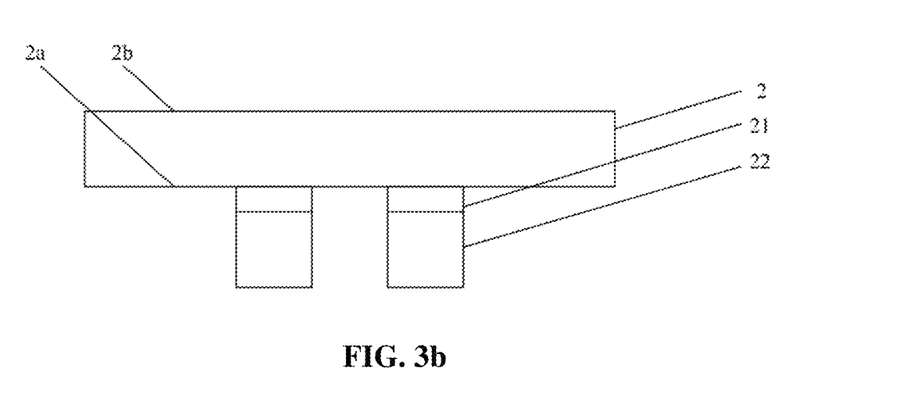

Then, the step 202 is performed. As shown in FIG. 3b, a chip 2 is provided, which has a first surface 2a and a second surface 2b opposite to each other, in which at least one conductive bump 22 is provided on the first surface 2a of the chip 2.

In an embodiment, a metal layer 21 under the bump is further provided on the first surface 2a of the chip 2, which is located between the first surface 2a and the conductive bump 22.

In an embodiment, the chip 2 is an active device, such as a Dynamic Random Access Memory (DRAM), but is not limited to this. The chip 2 may also be a passive device.

Figure 3C:
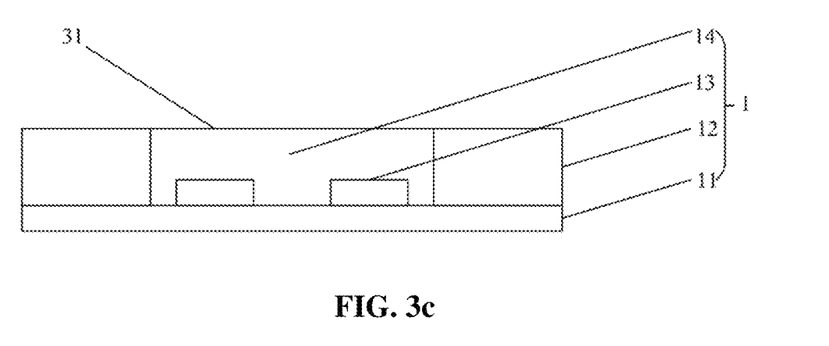

Then, the step 203 is performed. As shown in FIG. 3c, a first binder 31 is filled in the groove 14.

In an embodiment, the first binder 31 includes Non-Conductive Paste (NCP), which is pasty. The pasty first binder 31 fills the groove 14. In a specific embodiment, the first binder 31 includes a thermosetting resin.

In an embodiment, the filling of the first binder 31 in the groove 14 includes: the first binder 31 is filled in the groove 14 until the groove 14 is filled up, and the first binder 31 is flattened such that the upper surface of the first binder 31 is flush with the surface of the base 1.

The first binder 31 is filled in the groove 14 of the base 1 before the chip 2 is installed on the base 1, which can solve the problem that the air cannot be completely discharged from the groove 14 and thus gaps are formed, thereby greatly reducing the probability of bridging between conductive bumps 22 in the subsequent reflow soldering process, and thus improving the reliability of packaging.

Figure 3D:
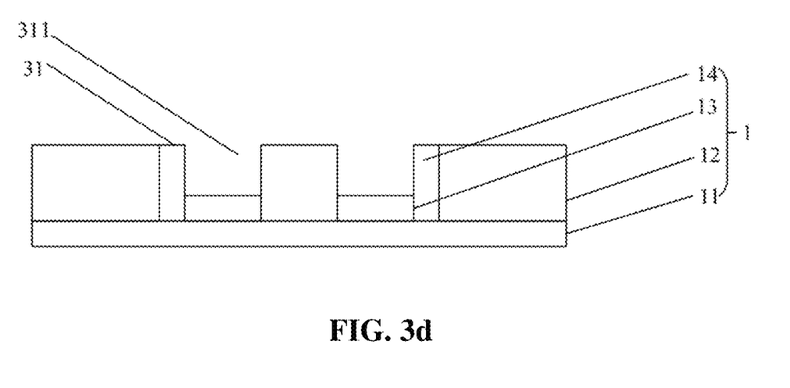

In an embodiment, the packaging method further includes: after the first binder 31 is filled in the groove 14, a second opening 311 exposing the pad 13 is formed in the first binder 31, as shown in FIG. 3d. The second opening 311 can facilitate the inflow of other binders (such as a second binder 32 described later) when the chip 2 is installed subsequently, so that the contact area between the first binder 31 and other binders is increased to increase the binding force.

It should be noted that the second opening 211 is optionally formed. In other embodiments, the step of forming the second opening 211 may be omitted.

Figure 3E:
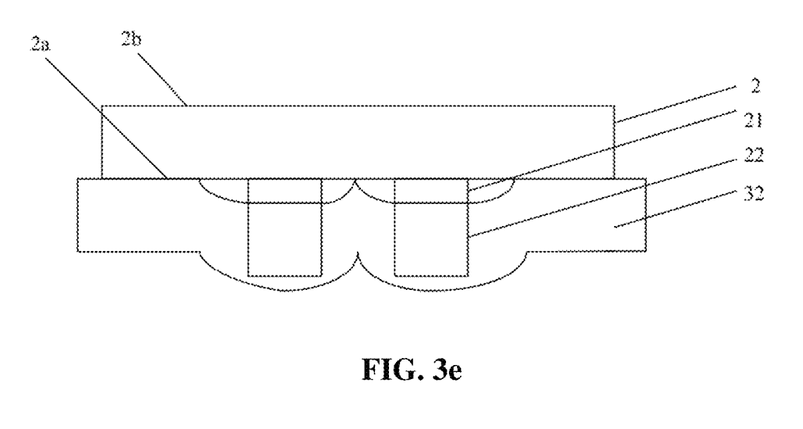

Then, the step 204 is performed. As shown in FIG. 3e, a second binder 32 is applied on the first surface 2a of the chip 2 and the conductive bump 22.

In an embodiment, the second binder 32 includes Non-Conductive Film (NCF), that is, it is in the form of film. In a specific embodiment, the second binder 32 includes a thermosetting resin.

In an embodiment, the thickness of the second binder 32 is greater than the thickness of the first binder 31. In this way, after the chip 2 is installed on the base 1, the second binder 32 can cover part of the side surface of the chip 2 to reduce the contact area between the subsequent Epoxy Molding Compound (EMC) and the side surface of the chip 2, thereby reducing the risk of peeling caused by the excessive difference between thermal expansion coefficients of the EMC and the chip 2.

Figure 3F:
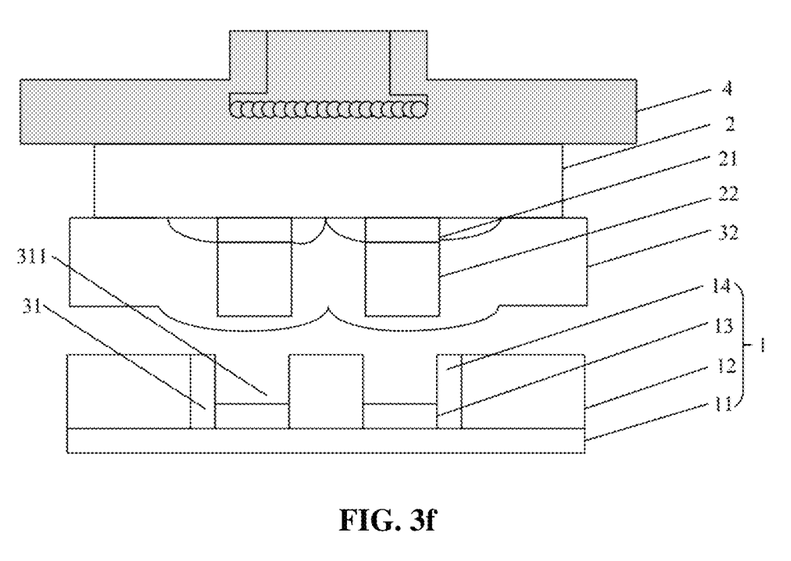
Figure 3G:
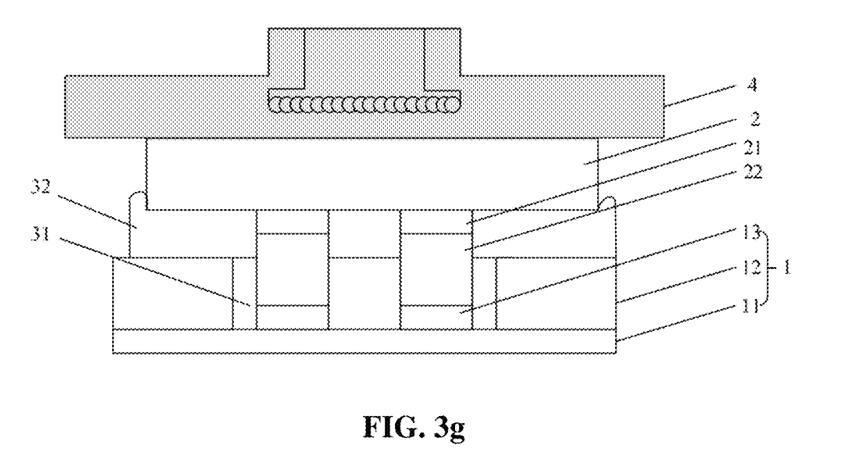

Then, the step 205 is performed. As shown in FIG. 3f and FIG. 3g, the chip 2 is installed on the base 1, with the conductive bump 22 passing through the first binder 31 and the second binder 32 to connect with the pad 13.

In an embodiment, the installation of the chip 2 on the base 1 includes the following operation.

A Thermo-Compression Bonder (TCB) 4 is provided, which is in contact with the second surface 2b of the chip 2 and heats and pressurizes the chip 2 to install the chip 2 on the base 1.

As shown in FIG. 3g, after the chip is installed on the base 1, the second binder 32 is in contact connection with both the first binder 31 and the surface of the base 1.

In an embodiment, the conductive bump 22 includes, but is not limited to, a solder, on which a reflow soldering process is performed after the chip 2 is installed on the base 1. The conductive bump may also be other suitable metal materials.

The packaging method further includes a step of curing the first binder 31 and the second binder 32 after installing the chip 2 on the base 1.

The embodiments of this disclosure further provide a packaging structure, including: a base with a groove in its surface, which includes at least one pad exposed by the groove; a first binder filled in the groove; a chip having a first surface and a second surface opposite to each other, at least one conductive bump being provided on the first surface of the chip; and a second binder located between the first surface of the chip and the first binder, the conductive bump passing through the second binder and the first binder to connect with the pad.

In the packaging structure provided in the embodiments of this disclosure, the first binder is filled in the groove, which greatly improves the reliability of the packaging structure compared with the packaging structure that only includes the second binder in related technologies.

In order to make the above objectives, features and advantages of this disclosure more apparent and understandable, the packaging structure provided in the embodiments of this disclosure will be further described in detail below with reference to FIG. 4.

Figure 4:
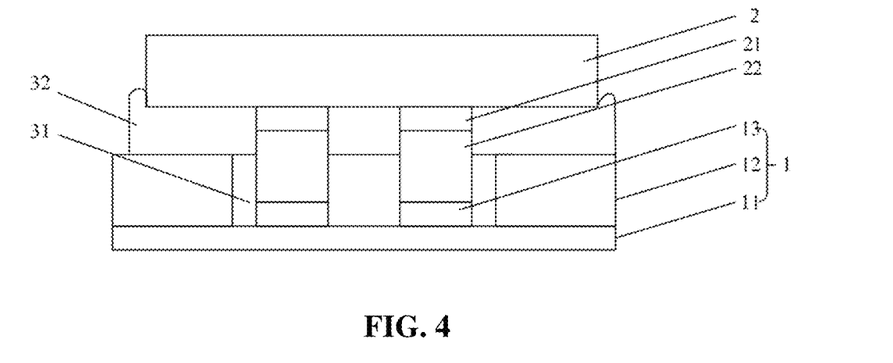
FIG. 4 is a schematic diagram of a packaging structure provided in the embodiments of this disclosure.

As shown in FIG. 4, the packaging structure includes a base 1, a first binder 31, a second binder 32, and a chip 2 installed on the base 1 by the first binder 31 and the second binder 32. The base 1 is provided with a groove 14 in its surface, and pads 13 exposed by the groove 14 are provided on the base 1, and the first binder 31 is filled in the groove 14. The chip 2 has a first surface 2a and a second surface 2b opposite to the first surface 2a. Conductive bumps 22 are provided on the first surface 2a, which pass through the first binder 31 and the second binder 32 to connect with the pads 13.

In an embodiment, the first binder 31 includes NCP. In a specific embodiment, the first binder 31 includes a thermosetting resin.

In an embodiment, the first binder 31 is filled into the groove 14 before the chip 2 is installed on the base 1, which can solve the problem that the air cannot be completely discharged from the groove 14 in the process that the chip 2 is installed on the base 1 only through the second binder 32, thereby greatly reducing the probability of bridging between the conductive bumps 22 in the subsequent reflow soldering process, and thus improving the reliability of packaging.

In an embodiment, the surface at which the first binder 31 is connected with the second binder 32 is flush with the surface of the base.

In an embodiment, the base 1 further includes a support plate 11 and a solder mask 12 formed on the support plate. The solder mask 12 has a first opening exposing the surface of the support plate 11, in which the first opening constitutes the groove 14 in the surface of the base. In a specific embodiment, the base 1 includes a PCB, and the solder mask 12 includes green paint.

In an embodiment, the second binder 32 includes NCF. In a specific embodiment, the second binder 32 includes a thermosetting resin.

In an embodiment, the second binder 32 is applied on the first surface 2a of the chip 2 and the conductive bump 22 before the chip 2 is installed on the base 1.

In an embodiment, the second binder 32 covers the first surface 2a of the chip 2 and part of the side surface of the chip 2. The second binder 32 covers part of the side surface of the chip 2 to reduce the contact area between the subsequent EMC and the side surface of the chip 2, thereby reducing the risk of peeling caused by the excessive difference between thermal expansion coefficients of the EMC and the chip 2.

In an embodiment, the second binder 32 is in contact connection with both the first binder 31 and the surface of the base.

In an embodiment, the conductive bump 22 includes a solder, but is not limited to this. The conductive bump 22 may also include other metal materials.

In an embodiment, referring to FIG. 4, metal layers under bump 21 are further provided on the first surface 2a of the chip 2, which is located between the first surface 2a and the conductive bump 22.

The embodiments described above are merely preferred embodiments of this disclosure, and are not intended to limit the protection scope of this disclosure. Any modification, equivalent replacement and improvement made within the spirit and principle of this disclosure are intended to be included within the protection scope of this disclosure.

The invention claimed is:

1. A packaging method, comprising:
   providing a base with a groove in a surface of the base, the base comprising at least one pad exposed by the groove;
   providing a chip, having a first surface and a second surface opposite to each other, at least one conductive bump being provided on the first surface of the chip;
   filling a first binder in the groove;
   applying a second binder on the first surface of the chip and the conductive bump; and
   installing the chip on the base, with the conductive bump passing through the first binder and the second binder to connect with the pad.

2. The packaging method of claim 1, wherein the first binder comprises non-conductive paste (NCP), and the second binder comprises non-conductive film (NCF).

3. The packaging method of claim 1, wherein a thickness of the second binder is greater than a thickness of the first binder.

4. The packaging method of claim 1, wherein filling the first binder in the groove comprises:
   filling the first binder in the groove until the groove is filled up, and flattening the first binder such that an upper surface of the first binder is flush with a surface of the base.

5. The packaging method of claim 1, wherein the first binder is a non-conductive binder, and comprises a thermosetting resin; and the second binder is a non-conductive binder, and comprises a thermosetting resin.

6. The packaging method of claim 1, wherein the base further comprises a support plate and a solder mask; and the step of providing the base with the groove in the surface of the base comprises: providing the support plate, and forming the solder mask with a first opening on the support plate, the first opening constituting the groove on the surface of the base.

7. The packaging method of claim 1, further comprising: after filling the first binder in the groove,
forming a second opening in the first binder, the second opening exposing the pad.

8. The packaging method of claim 1, wherein after the chip is installed on the base, the second binder is in contact connection with both the first binder and the surface of the base.

9. The packaging method of claim 1, wherein the step of installing the chip on the base comprises: providing a thermo-compression bonder (TCB), which is in contact with the second surface of the chip, and heats and pressurizes the chip to install the chip on the base.

10. The packaging method of claim 1, wherein the conductive bump comprises a solder; after the chip is installed on the base, a reflow soldering process is performed on the conductive bump.

11. The packaging method of claim 1, further comprising: curing the first binder and the second binder after installing the chip on the base.

12. A packaging structure, comprising:
a base with a groove in a surface of the base, the base comprising at least one pad exposed by the groove;
a first binder filled in the groove;
a chip, having a first surface and a second surface opposite to each other, at least one conductive bump being provided on the first surface of the chip; and
a second binder located between the first surface of the chip and the first binder, the conductive bump passing through the second binder and the first binder to connect with the pad.

13. The packaging structure of claim 12, wherein the first binder comprises Non-Conductive Paste (NCP), and the second binder comprises Non-Conductive Film (NCF).

14. The packaging structure of claim 12, wherein a surface at which the first binder is connected with the second binder is flush with the surface of the base.

15. The packaging structure of claim 12, wherein the first binder is a non-conductive binder, and comprises a thermosetting resin; and the second binder is a non-conductive binder, and comprises a thermosetting resin.

16. The packaging structure of claim 12, wherein the base further comprises a support plate and a solder mask formed on the support plate, wherein the solder mask has a first opening exposing a surface of the support plate, the first opening constituting the groove on the surface of the base.

17. The packaging structure of claim 12, wherein the second binder covers the first surface of the chip and part of a side surface of the chip.

18. The packaging structure of claim 12, wherein the second binder is in contact connection with both the first binder and the surface of the base.

19. The packaging structure of claim 12, wherein the conductive bump comprises a solder.

* * * * *